(12) United States Patent
Wu et al.

(10) Patent No.: US 12,406,970 B2
(45) Date of Patent: *Sep. 2, 2025

(54) SEMICONDUCTOR PACKAGE AND METHOD OF BONDING WORKPIECES

(71) Applicant: Taiwan Semiconductor Manufacturing Company, Ltd., Hsinchu (TW)

(72) Inventors: Bingchien Wu, Hsinchu (TW); Wei-Jen Wu, New Taipei (TW); Chun-Yen Lo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/415,558

(22) Filed: Jan. 17, 2024

(65) Prior Publication Data

US 2024/0153931 A1 May 9, 2024

Related U.S. Application Data

(63) Continuation of application No. 17/460,306, filed on Aug. 30, 2021, now Pat. No. 11,908,843.

(51) Int. Cl.
| | |
|---|---|
| *H01L 25/10* | (2006.01) |
| *H01L 21/66* | (2006.01) |
| *H01L 23/544* | (2006.01) |
| *H01L 25/00* | (2006.01) |
| *H01L 25/065* | (2023.01) |

(52) U.S. Cl.
CPC ............ *H01L 25/105* (2013.01); *H01L 22/20* (2013.01); *H01L 23/544* (2013.01); *H01L 25/0657* (2013.01); *H01L 25/50* (2013.01); *H01L 2223/54426* (2013.01); *H01L 2225/0651* (2013.01); *H01L 2225/06568* (2013.01); *H01L 2225/06586* (2013.01); *H01L 2225/1035* (2013.01); *H01L 2225/1058* (2013.01); *H01L 2225/1082* (2013.01)

(58) Field of Classification Search
CPC ..... H01L 25/105; H01L 22/20; H01L 23/544; H01L 25/0657; H01L 25/50; H01L 2223/54426; H01L 2225/1035; H01L 2225/1082; H01L 2225/1058
See application file for complete search history.

(56) References Cited

U.S. PATENT DOCUMENTS 11,908,843 B2 * 2/2024 Wu .......................... H01L 22/12

* cited by examiner

*Primary Examiner* — Thanh Y. Tran
(74) *Attorney, Agent, or Firm* — JCIPRNET

(57) ABSTRACT

A semiconductor package includes a first semiconductor device and a second semiconductor device. The first semiconductor device includes a first alignment pattern having a plurality of first scale patterns arranged in a first direction. The second semiconductor device is mounted over the first semiconductor device and includes a second alignment pattern having a plurality of second scale patterns arranged in a second direction parallel to the first direction, and a scale pitch of the first scale patterns is different from a scale pitch of the second scale patterns.

20 Claims, 15 Drawing Sheets

SEMICONDUCTOR PACKAGE AND METHOD OF BONDING WORKPIECES

CROSS-REFERENCE TO RELATED APPLICATION

This application is a continuation application of and claims the priority benefit of a prior application Ser. No. 17/460,306, filed on Aug. 30, 2021, now allowed. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
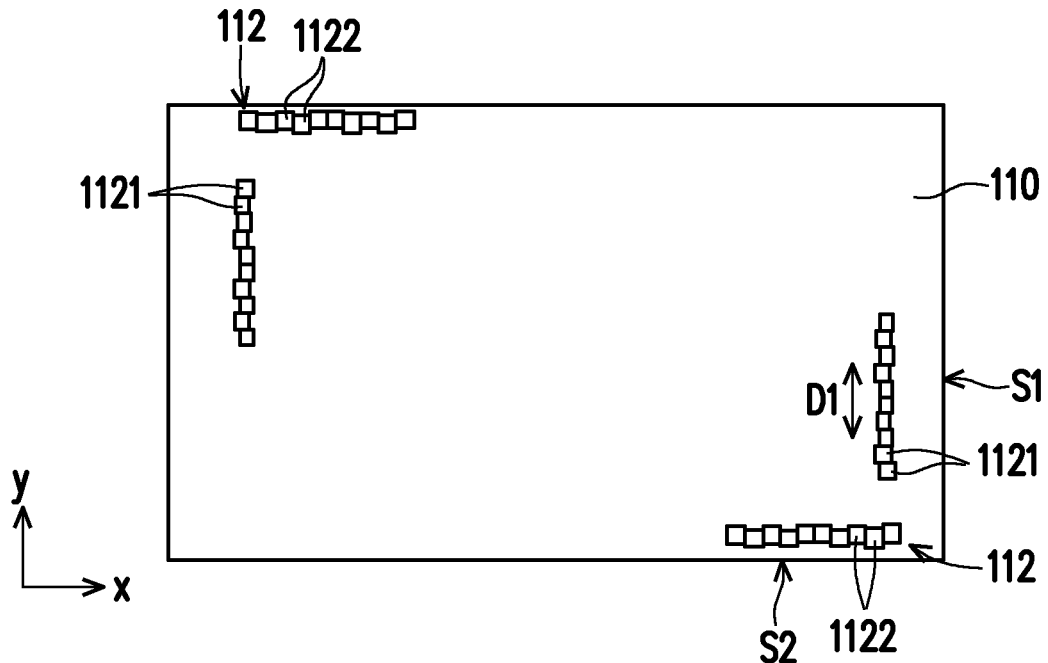
FIG. 1 illustrates a schematic top view of a first semiconductor device of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package, method of boding a plurality of workpieces and the method of manufacturing a semiconductor package are provided in accordance with various exemplary embodiments. Before addressing the illustrated embodiments specifically, certain advantageous features and aspects of the present disclosed embodiments will be addressed generally. A flip chip bonding apparatus with an infrared inspection device may be adopted for improving misalignment during a bonding process of two workpieces. Described below is a semiconductor packages including two workpieces (e.g., semiconductor devices) bonded together, and each of the workpieces has a plurality of scale patterns functioning as a scale (e.g., vernier caliper). Accordingly, an offset value can be detected by the infrared inspection device during the alignment of the workpieces. Thereby, the infrared inspection device is able to provide real time feedback to adjust the alignment accordingly, so as to improve efficiency of manufacturing process, and save production time and labor. In addition, the infrared inspection device may perform initial inspection before the bonding process to eliminate the workpieces with defects and adjust the bonding force according to topographical characteristics obtained from the initial inspection. Therefore, the bonding method and apparatus may also improve yield rate of the bonding process. The intermediate stages of forming the semiconductor package are illustrated in accordance with some embodiments. Some variations of some embodiments are discussed. Throughout the various views and illustrative embodiments, like reference numbers are used to designate like elements.

Figure 2:
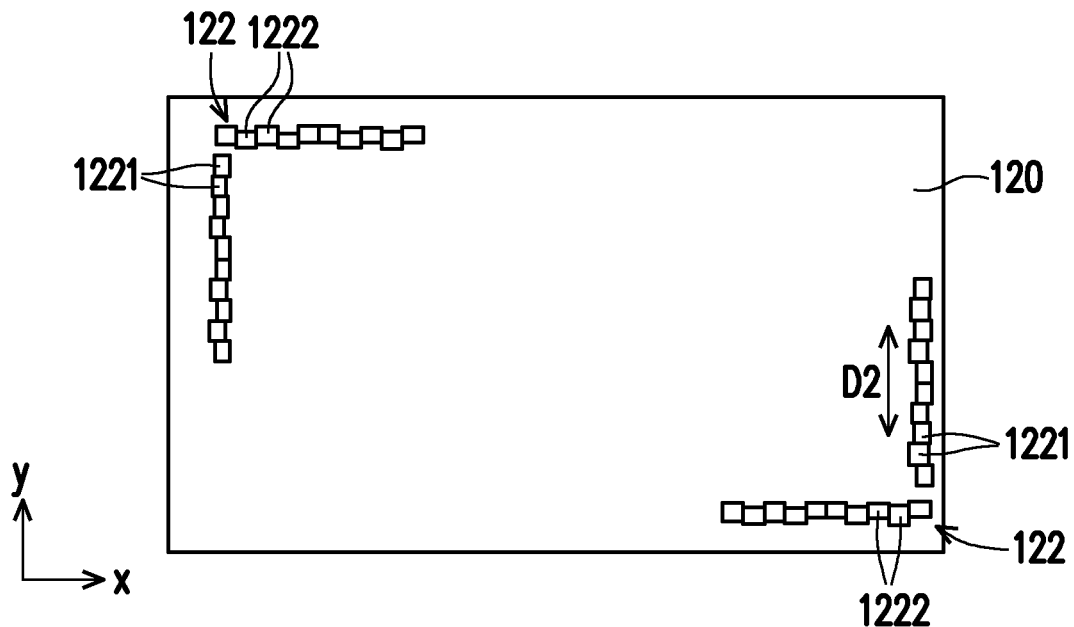
FIG. 2 illustrates a schematic top view of a second semiconductor device of a semiconductor package according to some embodiments of the present disclosure.

FIG. 1 illustrates a schematic top view of a first semiconductor device of a semiconductor package according to some embodiments of the present disclosure. FIG. 2 illustrates a schematic top view of a second semiconductor device of a semiconductor package according to some embodiments of the present disclosure. In some embodiments, a first workpiece 110 as shown in FIG. 1 and a second workpiece 120 as shown in FIG. 2 are provided. It is noted that the term "workpiece" as used herein can encompass a semiconductor device, which may be a whole wafer, a partial wafer (e.g., a die), a substrate, a package, or other types of whole or partial objects or components having one or more planar surface areas upon which a set of inspection processes, testing processes and/or other processing operations are desired or required. Referring firstly to FIG. 1, in the embodiment of the first workpiece being a (first) semiconductor device, the semiconductor device 110 may include a semiconductor substrate. In some embodiments, the semiconductor substrate may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Various active devices and/or passive devices may be formed either within or else on the semiconductor substrate. An interconnection structure including metallization layers and inter metal dielectric (IMD) layers can be formed over the semiconductor substrate to connect the various active devices and/or passive devices, resulting in functional circuitry. In some embodiments, the first semiconductor device 110 may be a semiconductor wafer including a plurality of semiconductor dies. In other embodiments, the first semiconductor device 110 may be a package substrate or a portion of a semiconductor wafer, such as one of the semiconductor dies after singularization process. The disclosure is not limited thereto.

In some embodiments, the first semiconductor device 110 includes at least one first alignment pattern 112. The first alignment pattern 112 may be disposed on a periphery of an uppermost layer of the first semiconductor device 110. In some embodiments, the first alignment pattern 112 has a plurality of (first) scale patterns 1121/1122 arranged in a first direction (e.g., direction D1) on the uppermost layer of the first semiconductor device 110. In the present embodiment, the first alignment pattern 112 may include two sets of scale patterns 1121, and 1122. For example, the scale patterns 1121 may be arranged in a direction (e.g., Y direction) parallel to a side S1 of the first semiconductor device 110. The scale patterns 1122 may be arranged in another direction (e.g., X direction) parallel to another side S2 of the first semiconductor device 110 intersected with the side S1. In other words, the scale patterns 1121 and the scale patterns 1122 are arranged along a corner of the first semiconductor device 110 respectively.

In some embodiments, the first semiconductor device 110 may include two sets of first alignment patterns 112 arranged, for example, diagonally on the first semiconductor device 110. In some embodiments, one set of the first alignment patterns 112, including the scale patterns 1121 and the scale patterns 1122, are disposed on, for example, a lower right corner, while another set of the first alignment patterns 112 including the scale patterns 1121 and the scale patterns 1122 are disposed on, for example, an upper left corner. The scale patterns 1121 and the scale patterns 1122 are respectively arranged along the sides that define the corresponding corner. It is noted that two sets of the first alignment patterns 112 are illustrated in FIG. 1. However, one of ordinary skill in the art will recognize that there may be more or less alignment patterns disposed over the semiconductor device.

With now reference to FIG. 2, in some embodiments, the second workpiece 120 may be a second semiconductor device 120, which may be a whole wafer, a partial wafer (e.g., a die), a substrate, a package, or the like. The second semiconductor device 120 may include a semiconductor substrate. In some embodiments, the semiconductor substrate of the second semiconductor device 120 is formed of a material similar to or the same as the material used as the semiconductor substrate of the first semiconductor device 110. In some embodiments, the second semiconductor device 120 includes at least one second alignment pattern 122, which has a plurality of (second) scale patterns 1221/1222 arranged in a second direction (e.g., direction D2) parallel to the first direction (e.g., direction D2) on the uppermost layer of the semiconductor device 120. In some embodiments, the layout of the second alignment pattern 122 may be similar to or the same as the layout of the first alignment pattern 112. In the present embodiment, the second alignment pattern 122 may include two sets of scale patterns 1121, and 1222. For example, the scale patterns 1221 may be arranged in a direction (e.g., Y direction) parallel to a side of the second semiconductor device 120. On the other hand, the scale patterns 1222 may be arranged in another direction (e.g., X direction) parallel to another side of the second semiconductor device 120. In other words, the scale patterns 1221 and the scale patterns 1222 are arranged along a corner of the second semiconductor device 120 respectively.

In some embodiments, the second semiconductor device 120 may include two sets of second alignment patterns 122 arranged, for example, diagonally on the second semiconductor device 120. In some embodiments, one set of the second alignment patterns 122, including the scale patterns 1221 and the scale patterns 1222, are disposed on, for example, a lower right corner, while another set of the second alignment patterns 122 including the scale patterns 1221 and the scale patterns 1222 are disposed on, for example, an upper left corner. The scale patterns 1221 and the scale patterns 1222 are respectively arranged along the sides that define the corresponding corner. It is noted that two sets of the second alignment patterns 122 are illustrated in FIG. 2. However, one of ordinary skill in the art will recognize that there may be more or less alignment patterns disposed over the semiconductor device.

Figure 3:
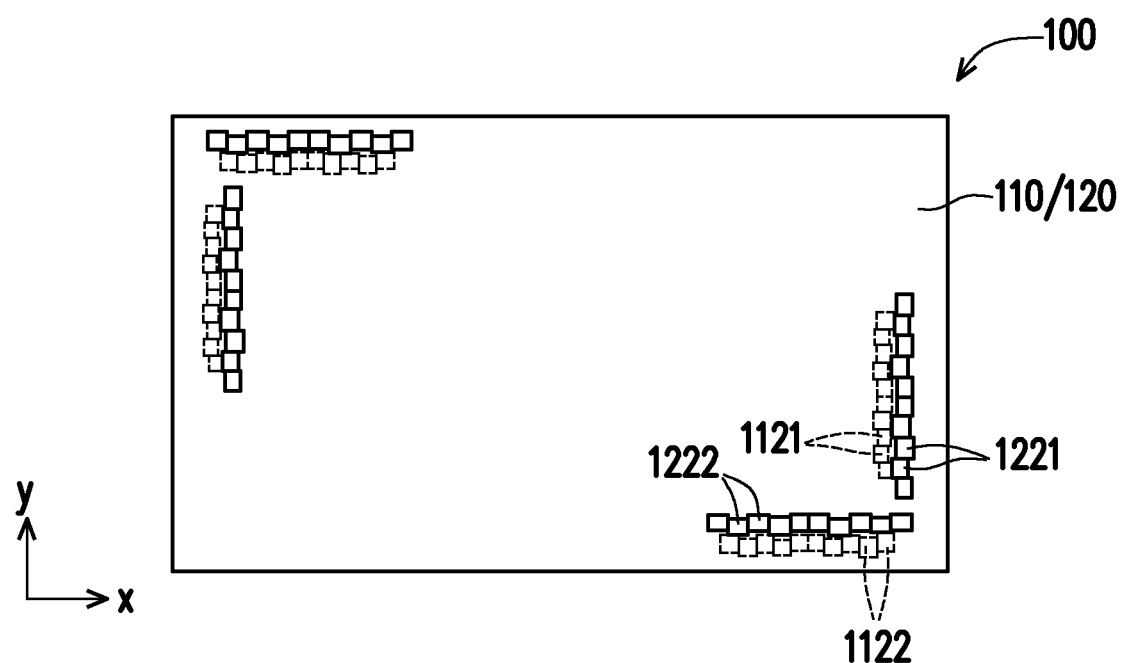
FIG. 3 illustrates a schematic top view of a semiconductor package according to some embodiments of the present disclosure.

FIG. 3 illustrates a schematic top view of a semiconductor package according to some embodiments of the present disclosure. Referring to FIG. 3, the second semiconductor device 120 may then be mounted over the first semiconductor device 110 through an alignment process and a bonding process to form a semiconductor package 100. It is noted that the semiconductor substrates of the first semiconductor device 110 and the second semiconductor device 120 are depicted in a perspective manner for convenience of illustration. During the alignment process, a relative position between the first semiconductor device 110 and the second semiconductor device 120 may be adjusted according to the first scale patterns 1121, 1122 of the first semiconductor device 110 and the second scale patterns 1221, 1222 of the second semiconductor device 120. For example, an offset value in Y direction may be obtained according to a shift between the first scale patterns 1121 of the first semiconductor device 110 and the second scale patterns 1221 of the second semiconductor device 120. An offset value in X direction may be obtained according to a shift between the first scale patterns 1122 of the first semiconductor device 110 and the second scale patterns 1222 of the second semiconductor device 120. Thereby, the relative position between the first semiconductor device 110 and the second semiconductor device 120 may be adjusted according to the offset values. It is noted that the first scale patterns 1121/1122 and the second scale patterns 1221/1222 may not overlap with each other from a top view when they are aligned. In the present embodiment, the first scale patterns 1121/1122 and the second scale patterns 1221/1222 are parallel to and spaced apart from each other when aligned. In some embodiments, the center line CL (or a reference line) of the first scale patterns 1121/1122 is collinear with the center line CL (or a reference line) of the second scale patterns 1221/1222 when aligned.

Figure 4:
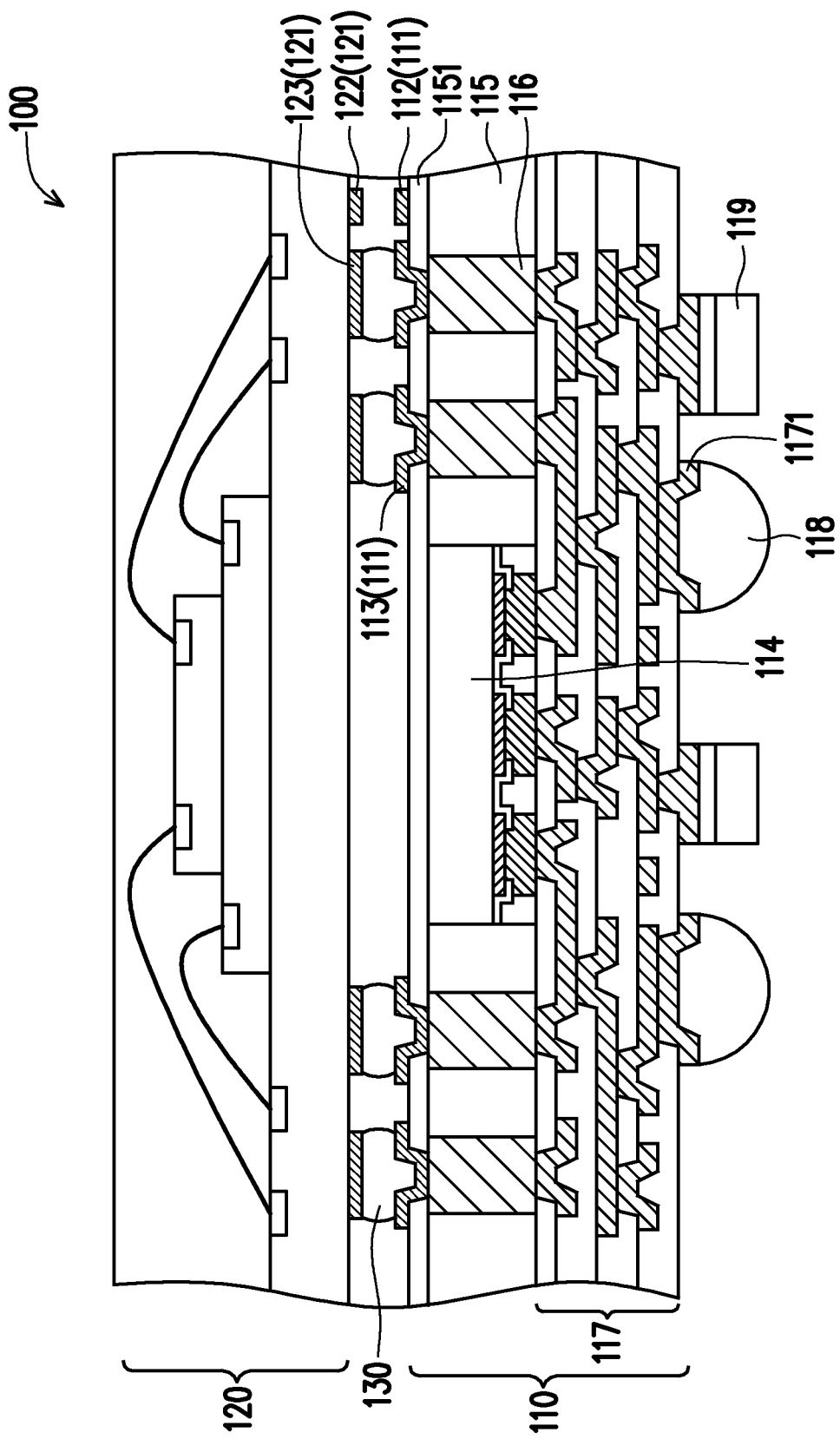
FIG. 4 illustrates a cross sectional view of a semiconductor package according to some embodiments of the present disclosure.

FIG. 4 illustrates a cross sectional view of a semiconductor package according to some embodiments of the present disclosure. It is noted that FIG. 4 illustrates one of the possible semiconductor packages that includes one of the possible formats of the semiconductor devices 110, 120 bonded together. As one of ordinary skill in the art will recognize, there are many other formats of the semiconductor devices 110, 120 that are suitable for incorporating the alignment patterns 112, 122 to realize precise alignment, and the disclosure is not limited thereto. Like reference numbers and characters in the figures below refer to like components. It is noted that the alignment patterns 112, 122 described above are illustrated in an abstract form as a block in FIG. 4 for convenience of illustration. Detail illustration and description of same or similar features may be omitted, and may be referred to previous contents in the disclosure.

Referring to FIG. 4, in some embodiments, the first semiconductor device 110 may be a package such as an integrated fan out package. In detail, first semiconductor device 110 may include a device die 114, a plurality of through vias 116, an encapsulating material 115 and a redistribution structure 117 as shown in FIG. 4. In one embodiment, the first semiconductor device 110 may have a wafer form in the process. In some embodiments, the through vias 116 may surround the device die 114, and the encapsulating material 115 may at least laterally encapsulate the device die 114 and the through vias 116. In other words, the encapsulating material 115 encapsulates the device die 114 therein, and the through vias 116 extends through the encapsulating material 115. The redistribution structure 117 is disposed over the device die 114 and the encapsulating material 115. The redistribution structure 117 is electrically connected to the device die 114 and the through vias 116.

In some embodiments, the device die 114 may be a logic device die including logic circuits therein. In some exemplary embodiments, the device die 114 may be a die that is designed for mobile applications, and may include a Power Management Integrated Circuit (PMIC) die and a Transceiver (TRX) die, for example. Although one device die 114 is illustrated, more dies may be encapsulated in the encapsulating material 115. In some embodiments, the encapsulating material 115 may include a molding compound, an epoxy, or a resin, etc.

In some embodiments, the redistribution structure 117 may be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuits are formed in the dielectric layers and electrically connected to the device die 114 and the through vias 116. In addition, an under bump metallurgy (UBM) layer 1171 may be formed on the redistribution structure 117 by sputtering, evaporation, or electroless plating, etc.

In some embodiments, a plurality of electrical connectors 118 may be disposed on the redistribution structure 117 in accordance with some exemplary embodiments. In one embodiment, at least one integrated passive device (IPD) 119 may also be disposed on the redistribution structure 117. The formation of the electrical connectors 118 may include placing solder balls on the UBM layer 1181 (or over the redistribution structure 117), and then reflowing the solder balls. In alternative embodiments, the formation of the electrical connectors 118 may include performing a plating process to form solder regions on the UBM layer 1181 (or over the redistribution structure 117), and then reflowing the solder regions. The electrical connector 118 may also include conductive pillars, or conductive pillars with solder caps, which may also be formed through plating. The IPD 119 may be fabricated using standard wafer fabrication technologies such as thin film and photolithography processing, and may be mounted on the redistribution structure 117 through, for example, flip-chip bonding or wire bonding, etc.

On the other side of the semiconductor device 110, at least one insulation layer 1151 having a plurality of openings may be provided. The openings may be located on the through vias 116 respectively to reveal the ends of the through vias 116. A first top metal layer 111 may be formed over the insulation layer 1151. In some embodiments, the first top metal layer 111 may include a first circuit pattern 113 and the first alignment pattern 112 described above. In some embodiments, the first alignment pattern 112 is electrically insulated from the first circuit pattern 113. The first circuit pattern 113 may cover the openings of the insulation layer 1151 and electrically connected to the through vias 116 and the conductive bumps 130. That is, the first alignment pattern 112 may be formed simultaneously (i.e., in the same step) with the uppermost circuit pattern 113 of the first semiconductor device 110.

In some embodiments, a plurality of conductive bumps 130 may be disposed on the first top metal layer 111 The conductive bumps 130 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. In one embodiment, the conductive bumps 130 may be, but not limited to, C4 bumps and may include a conductive material such as solder, copper, aluminum, gold, nickel, silver, palladium, tin, the like, or a combination thereof. In some embodiments, the conductive bumps 130 may include a eutectic material and may comprise a solder bump or a solder ball, as examples. The conductive bumps 130 may be formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

In some embodiments, the second semiconductor device 120 may be a package mounted over the first semiconductor device 110 and is electrically connected to the through vias 116 through the conductive bumps 130. In some embodiments, the conductive bumps 130 may be firstly mounted on the first semiconductor device 110, and then be bonded with the second semiconductor device 120 mounted thereon. In other embodiments, the conductive bumps 130 may be firstly mounted on the second semiconductor device 120 and then be bonded to the first semiconductor device 110. The disclosure is not limited thereto. In some embodiments, the second semiconductor device 120 may include a second top metal layer 121 facing the first top metal layer 111. In some embodiments, the second top metal layer 121 may include a second circuit pattern 123 and the second alignment pattern 122 described above. In some embodiments, the second alignment pattern 122 is electrically insulated from the second circuit pattern 123. That is, the second alignment pattern 122 may be formed simultaneously (i.e., in the same step) with the uppermost circuit pattern 123 of the second semiconductor device 120. The second circuit pattern 133 may electrically connected to the first circuit pattern 113 through the conductive bumps 130. It is noted that the spatially relative terms "top" used herein are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The "top metal layer" herein refers to the outermost metal layer of one of the semiconductor device 110/120 that faces the other one of the semiconductor device 120/110.

With such configuration, the second semiconductor device 120 can be aligned and bonded with the first semiconductor device 110 according to the alignment patterns 112 and the alignment patterns 122. Accordingly, the resulting semiconductor package 100 is a package on package (POP) structure as shown in FIG. 4. In some embodiments, the second semiconductor device 120 may be packages, device dies, passive devices, and/or the like. In some embodiments, the package on package structure may combine vertically discrete memory and logic packages, and the second semiconductor device 120 may be employed in a memory such as Dynamic Random Access Memory and others, but the disclosure is not limited thereto. In some embodiments, the bonding between the first semiconductor device 110 and the second semiconductor device 120 may be performed using flip chip bonding through the conductive bumps 130, which may include solder, for example. In some embodiments, a filler may be formed between the first semiconductor device 110 and the second semiconductor device 120 to encapsulate the conductive bumps 130 and cover the alignment patterns 112, 122. In some embodiments, the filler mentioned above may be the underfill or other suitable filler.

Figure 5:
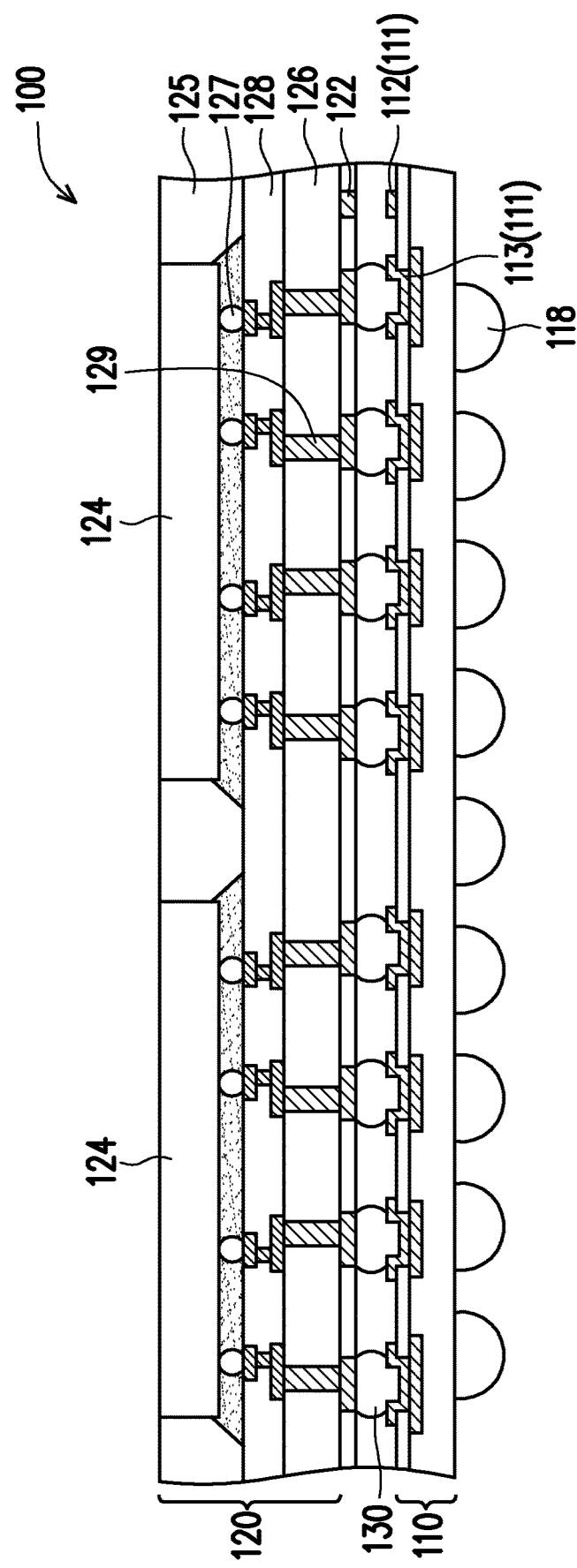
FIG. 5 illustrates a cross sectional view of a semiconductor package according to some other embodiments of the present disclosure.

FIG. 5 illustrates a cross sectional view of a semiconductor package according to some other embodiments of the present disclosure. It is noted that FIG. 5 illustrates one of the possible semiconductor packages that includes one of the possible formats of the semiconductor devices 110, 120 bonded together. As one of ordinary skill in the art will recognize, there are many other formats of the semiconductor devices 110, 120 that are suitable for incorporating the alignment patterns 112, 122 to realize precise alignment, and the disclosure is not limited thereto. Like reference numbers and characters in the figures below refer to like components. It is noted that the alignment patterns 112, 122 described above are illustrated in an abstract form as a block in FIG. 5 or convenience of illustration. Detail illustration and description of same or similar features may be omitted, and may be referred to previous contents in the disclosure.

Figure 6:
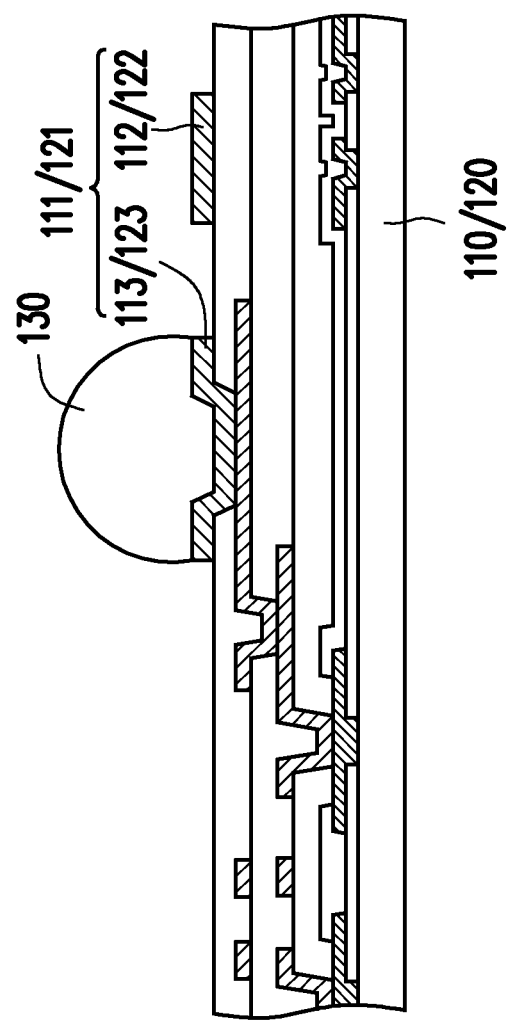
FIG. 6 illustrates a partial enlarged view of a semiconductor package according to some embodiments of the present disclosure.

With now reference to FIG. 5 and FIG. 6, in some embodiments, the semiconductor package 100 may be a chip on wafer on substrate package. In detail, the first semiconductor device 110 may be a package substrate. In some embodiments, the package substrate 110 may include the top metal layer 111 having the circuit patterns 113 and the alignment patterns 112 insulated from the circuit patterns 113. The circuit patterns 113 may include a plurality of substrate pads and/or UBM layer. In some embodiments, the conductive bumps 130 may be placed on the substrate pads and/or UBM layer of the circuit patterns 113. The first semiconductor device 110 may further include connectors 118 (e.g., ball grid array (BGA) balls) disposed on a surface opposite to the second semiconductor device 120 in accordance with various embodiments. The connectors 118 may be used to electrically connect the semiconductor package 100 to a motherboard (not shown) or another device component of an electrical system.

In some embodiments, the second semiconductor device 120 may include at least one device die 124 mounted on an interposer 126, for example, through a plurality of conductive bumps 127. In some embodiments, the conductive bumps 127 are electrically couple the circuits in the device die 124 to the redistribution structure 128 and the through vias 129 of the interposer 126. The device die 124 may be a logic die, such as a central processing unit (CPU), a graphics processing unit (GPU), the like, or a combination thereof. In some embodiments, the device die 124 may include a die stack (not shown) which may include memory die stack or a stack of logic dies and memory dies. In other embodiments, the device die 124 may include an input/output (I/O) die, such as a wide I/O die. It is noted that two device dies 124 are illustrated in FIG. 5. However, one of ordinary skill in the art will recognize that there may be more or less device die 124 disposed over the interposer 126.

In some embodiments, the device dies 124 may be encapsulated by an encapsulating material 125. The encapsulating material 125 fills the gaps between the device dies 124, and may be in contact with the redistribution structure 128. The encapsulating material 125 may be molded on the device dies 124, for example, using compression molding. In some embodiments, the encapsulating material 125 is made of a molding compound, a polymer, an epoxy, silicon oxide filler material, the like, or a combination thereof. A curing step may be performed to cure the encapsulating material 125, wherein the curing may be a thermal curing, a Ultra-Violet (UV) curing, the like, or a combination thereof.

In some embodiments, second semiconductor device 120 may further include the second top metal layer 121, which has a second circuit pattern 123 and the second alignment pattern 122 described above. In some embodiments, the second alignment pattern 122 is electrically insulated from the second circuit pattern 123. That is, the second alignment pattern 122 may be formed simultaneously (i.e., in the same step) with the uppermost circuit pattern 123 of the second semiconductor device 120. The second circuit pattern 133 may electrically connected to the first circuit pattern 113 through the conductive bumps 130. With such configuration, the second semiconductor device 120 can be aligned and bonded with the first semiconductor device 110 according to the alignment patterns 112 and the alignment patterns 122. In some embodiments, the bonding between the first semiconductor device 110 and the second semiconductor device 120 may be performed using flip chip bonding through the conductive bumps 130, which may include solder, for example. It is noted that the methods and the alignment patterns described in the disclosure can be applied to any two suitable devices to be aligned and bonded together through flip chip bonding. For example, the methods and the alignment patterns described in the disclosure may also be applied to the flip chip bonding between the device die 124 and the interposer 126, or the flip chip bonding between the package 100 and a motherboard (not shown), or the like.

Figure 7:
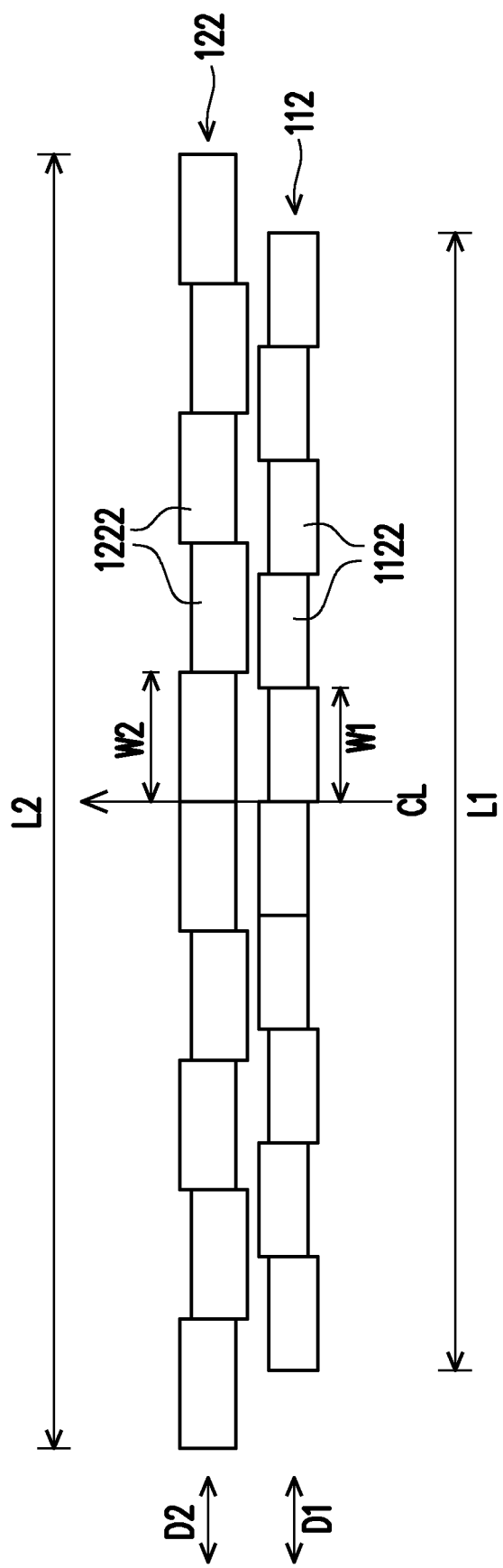
FIG. 7 illustrates a schematic top view of first scale patterns and second scale patterns according to some embodiments of the present disclosure.
Figure 8:
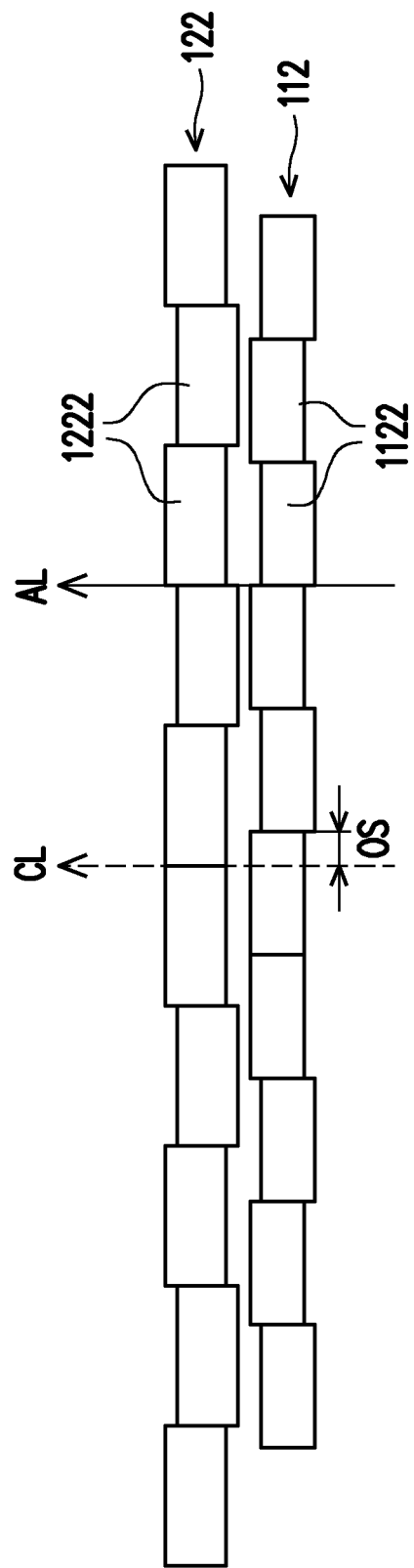
FIG. 8 illustrates an operational scenario of first scale patterns and second scale patterns according to some embodiments of the present disclosure.

FIG. 7 illustrates a schematic top view of first scale patterns and second scale patterns according to some embodiments of the present disclosure. FIG. 8 illustrates an operational scenario of first scale patterns and second scale patterns according to some embodiments of the present disclosure. FIG. 7 and FIG. 8 illustrates one of the possible formats of the scale patterns and takes the first scale patterns 1122 and the second scale patterns 1222 arranged in X direction for example to explain the principle of obtaining offset by the scale patterns. One of ordinary skill in the art will recognize that the first scale patterns 1121 and the second scale patterns 1221, or another other scale patterns on the semiconductor devices may have the same or similar arrangement to achieve the same or similar effect.

Referring to FIG. 7 and FIG. 8, in accordance with some embodiments of the disclosure, the first scale patterns 1122 may be a plurality of metal blocks arranged in a zigzag manner deviated from the first direction D1. Similarly, the second scale patterns 1222 may also be a plurality of metal blocks arranged in a zigzag manner deviated from the second direction D2 parallel to the first direction D1. Each of the metal blocks may be seen as one scale (unit) for measuring the offset value (distance) between the first semiconductor device 110 and the second semiconductor device 120. In other embodiments, the first scale patterns 1122 may be integrally formed, which means the interface or boundary between adjacent metal blocks may not exist and the first scale patterns 1122 may be a metal stripe with zigzag (meandering) pattern. Similar layout may also be applied to the second scale patterns 1122 and any other scale patterns on the devices. Such design for the scale patterns is easy to be fabricated through suitable photolithographic and etching process, and is easy to be detected by any optical device such as an infrared inspection device.

In some embodiments, the principle of using the scale patterns 1122 and 1222 to obtain the offset value between the semiconductor devices 110, 120 may be described as follows. FIG. 7 shows the state of the first semiconductor device 110 and the second semiconductor device 120 are aligned with each other without any offset. At such state, a center of the first scale patterns 1122 is aligned with the center of second semiconductor device 120 (along the center line CL). In accordance with some embodiments of the disclosure, during the aligning process, the second semiconductor device 120 may be seen as a stationary reference, and the first semiconductor device 110 may be movable to align with the second semiconductor device 120. Accordingly, the second scale patterns 1222 of the second semiconductor device 120 may be seen as a main (reference) scale, while the first scale patterns 1122 of the first semiconductor device 110 may be seen as a Vernier scale. In such embodiment, a scale pitch W1 of the first scale patterns 1122 is different from a scale pitch W2 of the second scale patterns 1222. To be more specific, a length L2 of (n−1) scale pitches of the second scale pattern 1222 is equal to a length L1 of (n) scale pitches of the first scale pattern 1122, wherein n denoted for the number of the scale pitches of the scale pattern.

For example, in the present embodiment, the length L1 of ten scale pitches on the first scale pattern 1122 substantially equals in length L2 to nine scale pitches on the second scale pattern 1222. That is, each scale pitch on the first scale pattern 1122 is spaced nine tenths of those on the second scale pattern 1222, which makes the scale patterns with a least count (also known as Vernier constant, resolution, or readability) of 0.1. The reading of the scale patterns is obtained by observing which of the scale pitch of the first scale pattern 1122 is co-incident with a scale pitch on the second scale pattern 1222, which is easier to perceive than visual estimation between two points. Such an arrangement can go to a higher resolution by using a higher scale ratio.

FIG. 8 shows the state of the first semiconductor device 110 or the second semiconductor device 120 is shifted with an offset OS. Accordingly, the first scale patterns 1121, 1122 on the first semiconductor device 110 or the second scale patterns 1221, 1222 on the second semiconductor device 120 is also shifted with the offset OS. To read (determined) the offset value OS, taking FIG. 8 for example, the main scale (second scale pattern 1222) reading is that to the left of the zero (center) on the Vernier scale (first scale pattern 1122), which is less than one scale, so the main scale reading is zero. The Vernier reading is found by locating the best aligned lines AL between the two scale patterns 1122, 1222, which is the second scale, so the Vernier reading is 0.2. Accordingly, the offset value OS is zero plus 0.2, which is 0.2 (μm). Therefore, a more precise offset value OS can be obtained with the help of the first scale patterns 1121, 1122 on the first semiconductor device 110 and the second scale patterns 1221, 1222 on the second semiconductor device 120.

The embodiment shown in FIG. 8 illustrates the offset OS in, for example, X direction. However, the same method can be used to determine the offset in the Y direction by using the first scale patterns 1121, and the second scale patterns 1221, which are arranged in the Y direction. In addition, a skew or rotation of the semiconductor devices may also be detected when the first scale patterns and the second scale patterns are not parallel to each other. If one of the offsets does not substantially equal to zero (e.g., greater than a predetermined value), corresponding adjustment is required to compensate for the shift during the aligning process.

Figure 9:
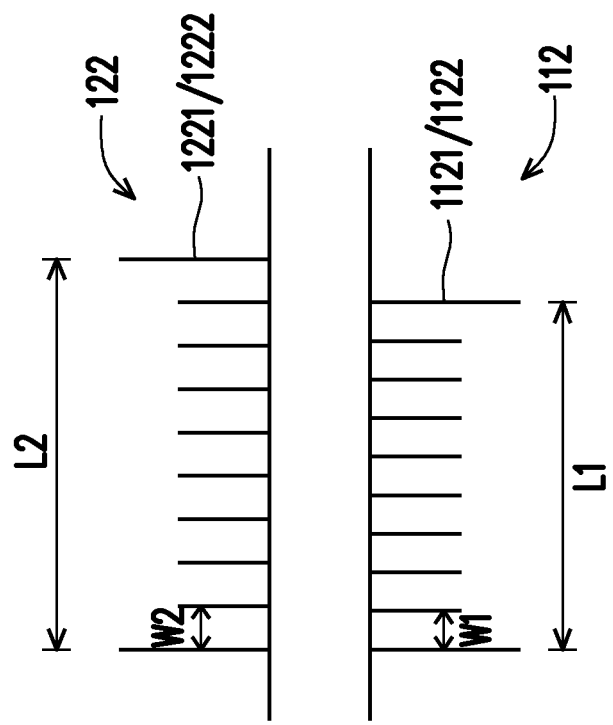
FIG. 9 illustrates a schematic top view of first scale patterns and second scale patterns according to some other embodiments of the present disclosure.

FIG. 9 illustrates a schematic top view of first scale patterns and second scale patterns according to some other embodiments of the present disclosure. Referring to FIG. 9, in accordance with some embodiments of the disclosure, the first scale patterns 1121, 1122 and the second scale patterns 1221, 1222 may be printed (or deposited) on the first semiconductor device 110 and the second semiconductor device 120 in a typical Vernier scale format. That is, ten divisions on the Vernier scale (e.g., first scale patterns 1121/1122) equal in distance to nine divisions on the main scale (e.g., second scale patterns 1221/1222). Accordingly, each scale pitch W1 on the first scale patterns 1121/1122 is one tenth short of each scale pitch W2 on the second scale patterns 1221/1222. The offset value between the first scale patterns 1121/1122 and the second scale patterns 1221/1222 is determined in the same or at least similar fashion as the embodiment shown in FIG. 8 described above.

Figure 10:
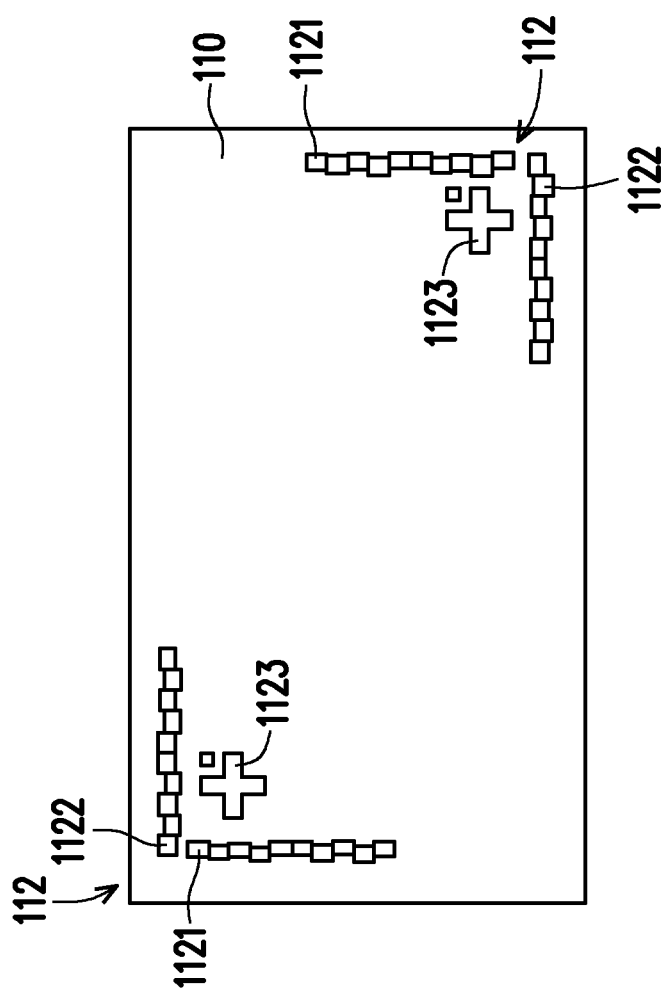
FIG. 10 illustrates a schematic top view of a first semiconductor device according to some embodiments of the present disclosure.
Figure 11:
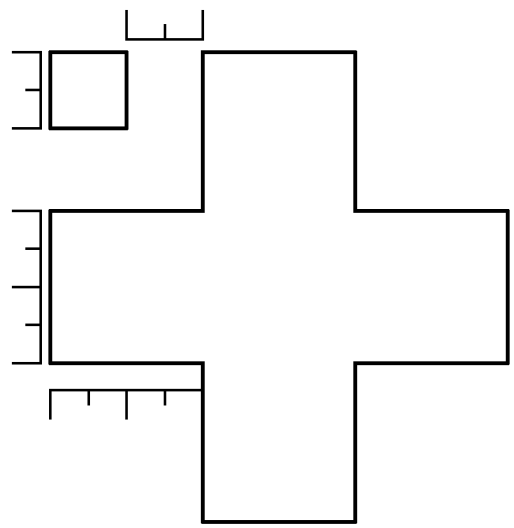
FIG. 11 illustrates a schematic top view of an alignment mark according to some embodiments of the present disclosure.

FIG. 10 illustrates a schematic top view of a first semiconductor device according to some embodiments of the present disclosure. FIG. 11 illustrates a schematic top view of an alignment mark according to some embodiments of the present disclosure. It is noted that the semiconductor package shown in FIG. 10 and FIG. 11 contains many features same as or similar to the semiconductor packages disclosed earlier in the previous embodiments. For purpose of clarity and simplicity, detail description of same or similar features may be omitted, and the same or similar reference numbers denote the same or like components. The main differences between the semiconductor package shown in FIG. 10 and FIG. 11 and the semiconductor packages in the previous embodiments are described as follows.

With now reference to FIG. 10 and FIG. 11, in some embodiments, the first alignment pattern 112 further has a first alignment mark 1123 adjacent to the first scale patterns 1121, 1122. Similarly, the second alignment pattern 122 further has a second alignment mark 1223 with the same or at least similar layout shown in FIG. 10. When the first semiconductor device 110 and the second semiconductor device 120 are aligned with each other, a contour of the first alignment mark 1123 is alignment with a contour of the second alignment mark 1223 from a top view as it is shown in FIG. 11. The first alignment mark 1123 and the second alignment mark 1223 may be designed in specific dimensions (e.g., the scales illustrated in FIG. 11), so the alignment marks 1123, 1223 may also function as a scale to further confirm the offset value between the first semiconductor device 110 and the second semiconductor device 120. It is noted that the scales on the alignment marks 1123, 1223 may or may not be marked on the semiconductor device along with the alignment marks 1123, 1223, and each of the scale pitch may be, for example, 10 μm to 15 μm. However, the disclosure is not limited thereto.

Figure 12:
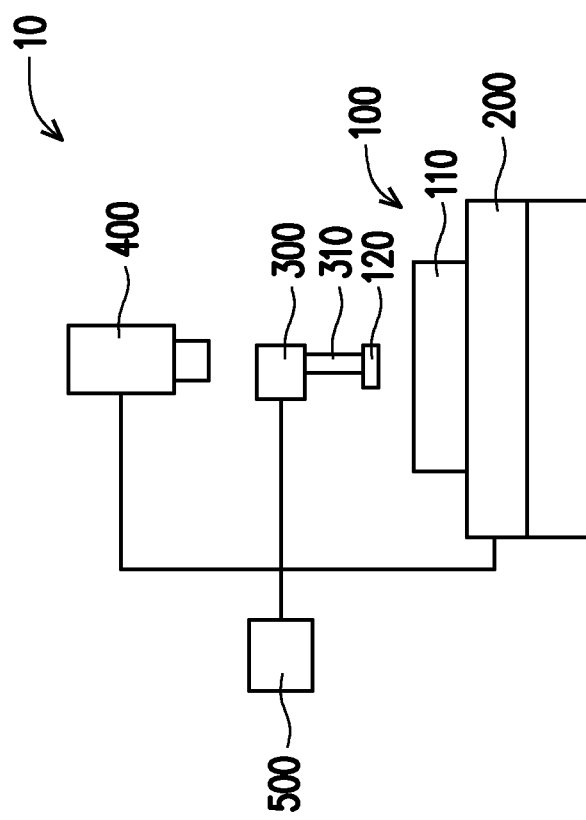
FIG. 12 illustrates a schematic view of a flip chip bonding apparatus according to some embodiments of the present disclosure.
Figure 13:
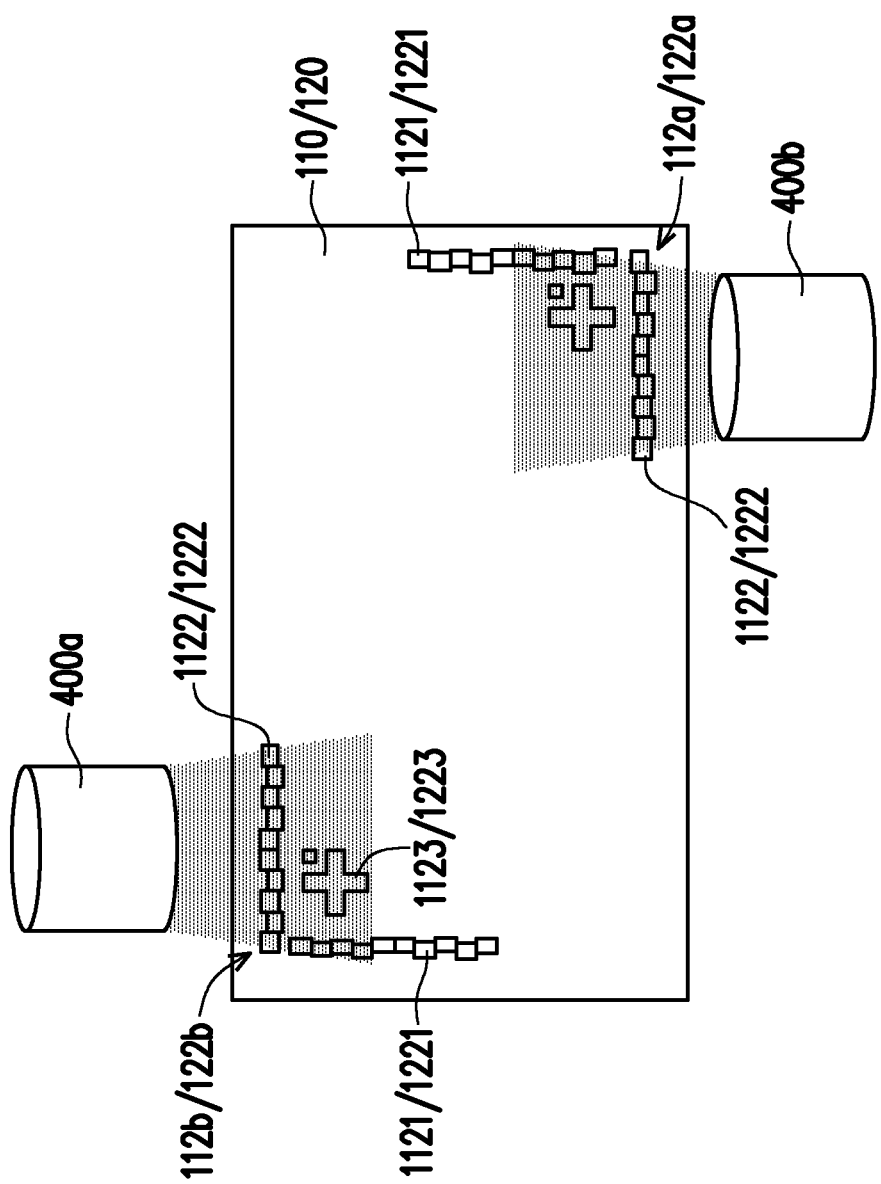
FIG. 13 illustrates an operational scenario of infrared inspection devices of a flip chip bonding apparatus according to some embodiments of the present disclosure.
Figure 14:
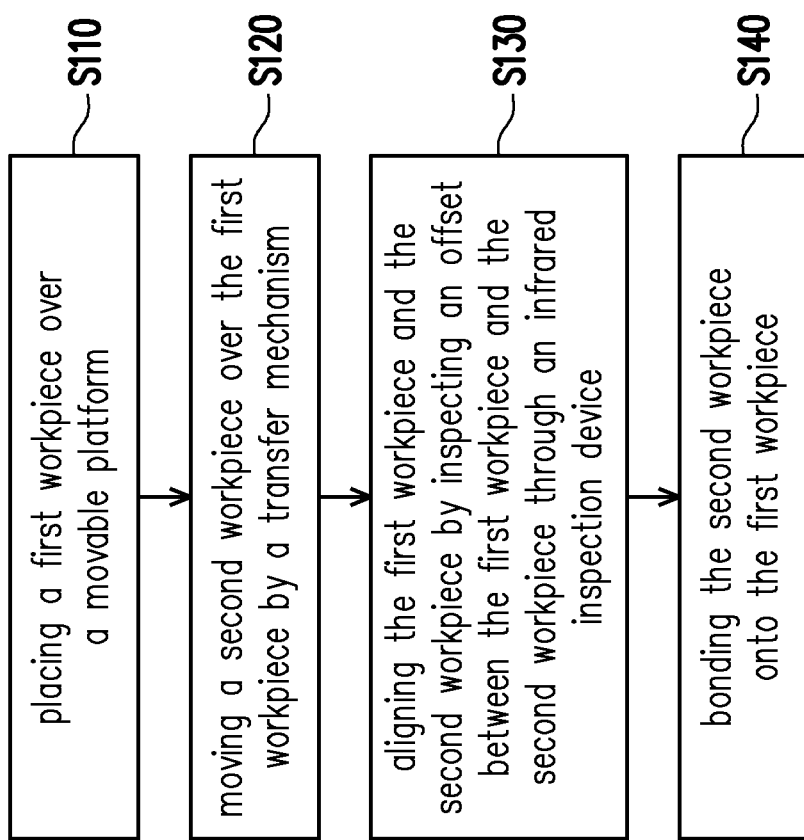
FIG. 14 illustrates a flow chart of intermediate stages in bonding a plurality of workpieces according to some embodiments of the present disclosure.

FIG. 12 illustrates a schematic view of a flip chip bonding apparatus according to some embodiments of the present disclosure. FIG. 13 illustrates an operational scenario of infrared inspection devices of a flip chip bonding apparatus according to some embodiments of the present disclosure. FIG. 14 illustrates a flow chart of intermediate stages in bonding a plurality of workpieces according to some embodiments of the present disclosure. The alignment method described above can be executed with a flip chip bonding apparatus 10 shown in FIG. 12 to perform bonding of a plurality of workpieces (e.g., the first semiconductor device 110, and the second semiconductor device 120).

Referring to FIG. 12 to FIG. 14, in some embodiments, the flip chip bonding apparatus 10 may include a movable platform 200, a transfer mechanism 300, at least one infrared inspection device 400 disposed over the movable platform 200, and a controller 500. The movable platform 200, the transfer mechanism 300, the infrared inspection device 400 are under unified control of the controller 500, and movable in multiple degrees of freedom. The method (process) begins at step S110 where a first workpiece 110 (e.g., the first semiconductor device 110) is placed over the movable platform 200. The movable platform 200 is configured to hold the first semiconductor device 110 in place and is capable of adjusting the position of the first semiconductor device 110 by horizontally moving the first semiconductor device 110 placed thereon in the X direction and/or the Y direction. That is, the first semiconductor device 110 is moved horizontally by the movable platform 200 to align the first alignment pattern 112 with the second alignment pattern 122, and the movable platform 200 serves as a workpiece positioning portion.

The method then proceeds to step S120 where a second workpiece 120 is moved over the first workpiece 110 by the transfer mechanism 300. In some embodiments, the second workpiece 120 is moved toward the first workpiece 110 in the Z direction (vertically) by the transfer mechanism 300. In some embodiments, the transfer mechanism 300 may include a robotic arm in accordance with some embodiments. As introduced above, the robotic arm may be a programmable mechanical arm to grasp, hold, and manipulate workpieces. The robotic arm may include an end effector 310. For purpose of brevity and to aid understanding, the term "end effector" as used herein may be any type of end effector used for grasping or holding a workpiece. In one embodiment, the transfer mechanism 300 may be configured to be movable in the Z-direction. Additionally, the end effector 310 may be mounted at the bottom of the transfer mechanism 300. In the present embodiment, the end effector 310 is a nozzle, which grabs a workpiece by suction force. However, in alternative embodiments, other end effector may be adopted, such as a pressure end effector (e.g., gripping by applying pressure to a workpiece, such as with a pincer type motion), an area end effector (e.g., gripping by surrounding a workpiece to be manipulated), and a magnetic end effector (e.g., gripping by use of electromagnetic forces). The disclosure is not limited thereto. The end effector 310 may be mounted on a robotic arm with at least one degree of freedom that connects the end effector 310 to a base. For example, the end effector 310 may be a nozzle that applies vacuum force selectively to retrieve, hold, and place a workpiece such as a die during transport by the transfer mechanism 300 (e.g., as a pick and place head vacuum holder). In some embodiments, the end effector 310 may be a rubber nozzle, a ceramic nozzle or any other nozzles that can pick up and retain the target workpiece by, for example, suction.

Referring to FIG. 3 and FIG. 12, the method then proceeds to step S130 where the first workpiece 110 and the second workpiece 120 are aligned by inspecting the offset between the first alignment pattern 112 on the first workpiece 110 and the second alignment pattern 122 on the second workpiece 120 through the infrared inspection device 400. In some embodiments, the infrared inspection device 400 may be, for example, an infrared optical microscope (IROM), or the like. In some embodiments, the substrate of the semiconductor devices 110, 120 are made from appropriate semiconductor materials such as silicon, germanium, silicon germanium, or the like, which have the property that it is transparent to low energy in the infrared portion of the spectrum but it is opaque to photons in the visible portion of the spectrum. This transparency of silicon to the infrared (IR) is beneficial in aligning the semiconductor devices 110, 120. The materials of the substrates of the semiconductor devices 110, 120 do not substantially filter desired infrared wavelengths, namely the infrared transmitting materials. On the other hand, the top metal layers on the bonding surfaces of the semiconductor devices 110, 120 prevent infrared transmission. Accordingly, the infrared irradiation of the infrared inspection device 400 is transmitted through both substrates of the first semiconductor device 110 and the second semiconductor device 120 and the image is captured on a screen where the features or alignment patterns 112, 122 (made of metal material) on the semiconductor devices 110, 120 can be aligned. In addition, the IR radiation is lower in energy than X ray, so it can transmit through the substrates of the semiconductor devices 110, 120 without damaging metal layers on and/or in the semiconductor devices 110, 120. Therefore, the infrared inspection device 400 is suitable for being installed on the flip chip bonding apparatus 10 to perform in-situ defect inspection and real time alignment monitoring. Accordingly, by detecting the alignment patterns 112, 122 with the infrared inspection device 400, the offset between the semiconductor devices 110, 120 can be obtained, and the movable platform 200 can shift the semiconductor device 110 (or the semiconductor device 120) to compensate the offset accordingly. Thereby, the semiconductor devices 110, 120 can be precisely aligned before the bonding process is performed, so as to improve yield rate and rework time of the manufacturing process.

Referring to FIG. 12 and FIG. 13, in some embodiments, each of the semiconductor devices 110, 120 may include plurality sets of the alignment patterns. For example, two set of the alignment patterns 112a, 112b, each including the scale patterns 1121, 1122 and the alignment mark 1123, are arranged diagonally on the first semiconductor device 110. Similarly, two set of the alignment patterns 122a, 122b, each including the scale patterns 1221, 1222 and the alignment mark 1223, are arranged diagonally on the second semiconductor device 120. In such embodiment, the flip chip bonding apparatus 10 may include a plurality of infrared inspection devices (two infrared inspection devices 400a and 400b are illustrated, but not limited thereto) disposed over the movable platform 200. As such, each of the infrared inspection devices 400a, 400b is configured to recognize each set of the alignment patterns 112a, 112b, so the alignment can perform simultaneously without having to move one infrared inspection device 400 to several positions to recognize the alignment patterns one by one. Therefore, the process time can be saved and undesirable vibration caused by horizontal movement of the infrared inspection device 400 can be avoided or at least reduced. It is noted that the alignment patterns in FIG. 13 are depicted in a simplified manner for convenience of illustration. The detail illustration of the alignment pattern and aligning method thereof can be reference to the previous embodiments.

The method then proceeds to step S140 where the second workpiece (e.g., semiconductor device) 120 onto the first workpiece (e.g., semiconductor device) 110. In some embodiments, once the infrared inspection device 400 detected that the semiconductor devices 110 and 120 are aligned with each other, the transfer mechanism 300 may perform a lowering operation (e.g., in the Z direction). The transfer mechanism 300 may press the conductive bumps of the second semiconductor device 120, which is vacuum-sucked on the end effector 310, against the electrodes of the first semiconductor device 110 for bonding. In other embodiments, the conductive bumps may be provided on the first semiconductor device 110, and the transfer mechanism 300 presses the second semiconductor device 120, which is vacuum-sucked on the end effector 310, against the conductive bumps of the first semiconductor device 110 for bonding.

Figure 15:
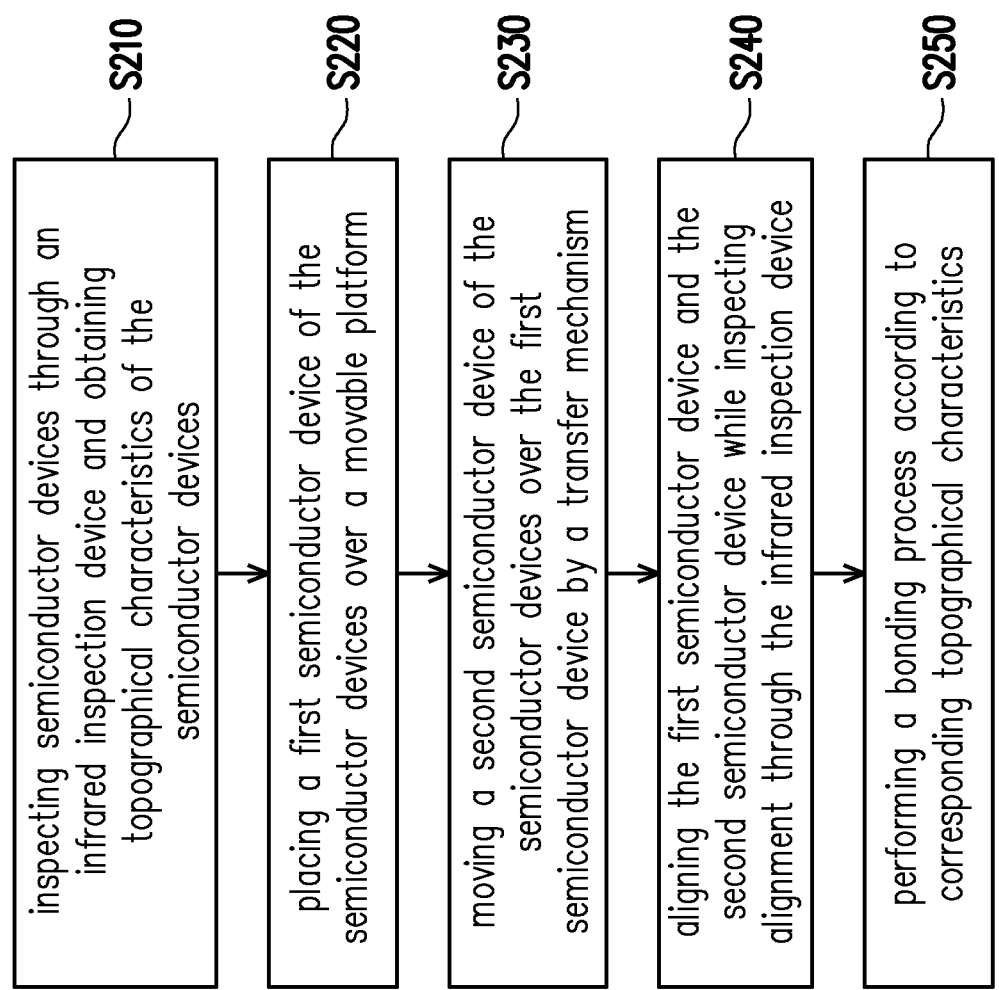
FIG. 15 illustrates a flow chart of intermediate stages in manufacturing a semiconductor package according to some embodiments of the present disclosure.
Figure 16:
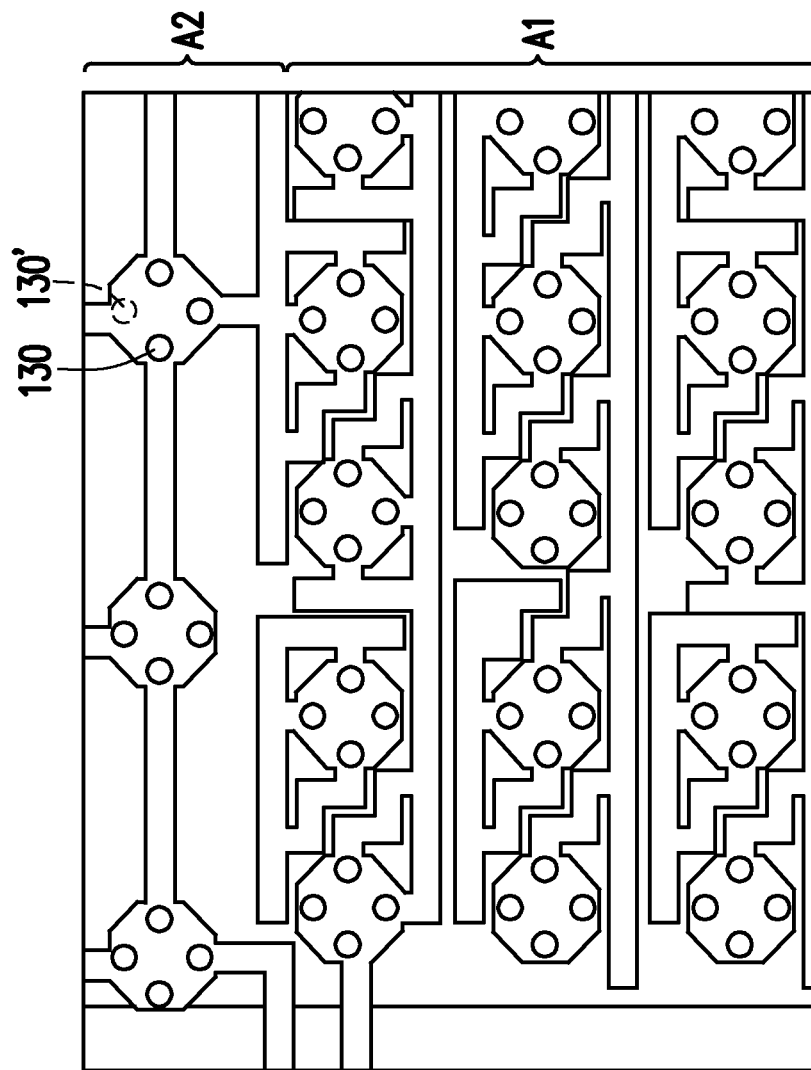
FIG. 16 illustrates a top view of a semiconductor device according to some embodiments of the present disclosure.

FIG. 15 illustrates a flow chart of intermediate stages in manufacturing a semiconductor package according to some embodiments of the present disclosure. FIG. 16 illustrates a top view of a semiconductor device according to some embodiments of the present disclosure. A manufacturing method of a semiconductor package can be performed by the flip chip bonding apparatus 10 shown in FIG. 12. It is noted that the manufacturing method shown in FIG. 15 contains many features and steps same as or similar to the bonding method disclosed in the previous embodiments. For purpose of clarity and simplicity, detail description of same or similar features may be omitted, and the same or similar reference numbers denote the same or like components.

Referring to FIG. 12, FIG. 15 and FIG. 16, the method begins at step S210 where a plurality of semiconductor devices are inspected through the infrared inspection device 400 and obtaining a plurality of topographical characteristics of the semiconductor devices. In some embodiments, the infrared inspection device 400 disposed over the movable platform 200 is configured to perform inspection before and during the alignment of the first semiconductor device 110 and the second semiconductor device 120. Before the alignment process, the infrared inspection device 400 may perform inspections on each of the semiconductor devices (e.g., the first semiconductor device 110 and the second semiconductor device 120) to be bonded. Accordingly, the topographical characteristics of the semiconductor devices 110 and 120 are obtained by the infrared inspection device 400 and may be processed and analyzed by a system processor. If any defect (e.g., bump missing, bump scratched, or the like) is detected on one of the semiconductor devices to be bonded, the one of the semiconductor devices with the defect would be abandoned, and a new one is provided to be inspected. For example, the processor may analyze the image obtained by the infrared inspection device 400 illustrate in FIG. 16 by, for example, comparing the image to a golden image of a normal bonding surface, and determines the bump 130' on the semiconductor device is missing. Then, the controller may dictate the transfer mechanism 300 to eliminate such semiconductor device with missing bump. The first semiconductor device 110 and the second semiconductor device 120 pass the defect detection of the infrared inspection device 400, and can proceed with the sequential process. Namely, the semiconductor devices that pass the inspection can go on with the sequential processes. Therefore, by performing topographical inspection by the infrared inspection device 400 before the aligning process, yield rate production efficiency can be improved.

In addition, for the semiconductor devices that pass the inspection, the topographical characteristics thereof may also be utilized to pre-adjust (forecast) parameters of the bonding process. For example, the bonding force for the bonding process may be adjusted or predetermined according to the topographical characteristics. The topographical characteristics may include density of the conductive bumps 130 on the semiconductor device 110 or 120, coplanarity of the conductive bumps 130 on the semiconductor device 110 or 120, or the like. For example, as illustrated in FIG. 16, the density of the conductive bumps 130 in the area (e.g., a central area of the device) A1 is greater than the density of the conductive bumps 130 in the area (e.g., a peripheral area of the device) A2. Accordingly, the bonding force applied on the area A1 is set to be greater than bonding force applied on the area A2 since higher bump density needs higher bonding force. If the coplanarity of the conductive bumps 130 in the area A1 is greater than the coplanarity of the conductive bumps 130 in the area A2, the bonding force applied on the area A1 is set to be smaller than bonding force applied on the area A2 since worse coplanarity needs higher bonding force. Other factors may also be considered in forecasting the bonding force. For example, if the flux to be used is at the end of the lifetime, higher bonding force is also needed.

The step S220 to step S240 contains many features same as or similar to the step S110 to step S130 of the bonding method disclosed in the previous embodiments. For purpose of clarity and simplicity, detail description of same or similar features may be omitted, and the same or similar reference numbers denote the same or like components. After the alignment process is performed, the method then proceeds to step S20 where a bonding process is performed according to the topographical characteristics of the first semiconductor device 110 and the second semiconductor device 120. That is, the bonding force, that is predetermined (forecast) according to the topographical characteristics of the first semiconductor device 110 and the second semiconductor device 120, is applied to press the conductive bumps 130 against the electrodes on the first semiconductor device 110 (or the second semiconductor device 120) for bonding.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a first semiconductor device, and a second semiconductor device. The first semiconductor device includes a first alignment pattern having a plurality of first scale patterns arranged in a first direction. The second semiconductor device is mounted over the first semiconductor device and includes a second alignment pattern having a plurality of second scale patterns arranged in a second direction parallel to the first direction, and a scale pitch of the first scale patterns is different from a scale pitch of the second scale patterns.

In accordance with some embodiments of the disclosure, a method of bonding a plurality of workpieces includes the following steps. A first workpiece is placed over a movable platform. A second workpiece is moved over the first workpiece by a transfer mechanism. The first workpiece and the second workpiece are aligned by inspecting an offset between a first alignment pattern on the first workpiece and a second alignment pattern on the second workpiece through an infrared inspection device. The second workpiece is bonded onto the first workpiece.

In accordance with some embodiments of the disclosure, a method of manufacturing a semiconductor package includes the following steps. A plurality of semiconductor devices are inspected through an infrared inspection device and a plurality of topographical characteristics of the plurality of semiconductor devices are obtained. A first semiconductor device of the plurality of semiconductor devices is placed over a movable platform. A second semiconductor device of the plurality of semiconductor devices is moved over the first semiconductor device by a transfer mechanism. The first semiconductor device and the second semiconductor device are aligned while inspecting alignment through the infrared inspection device. A bonding process is performed according to corresponding topographical characteristics of the first semiconductor device and the second semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first semiconductor device comprising a first alignment pattern having a plurality of first scale patterns arranged in a zigzag manner deviated from a first direction; and
a second semiconductor device mounted over the first semiconductor device and comprising a second alignment pattern having a plurality of second scale patterns arranged in a zigzag manner deviated from a second direction parallel to the first direction.

2. The semiconductor package as claimed in claim 1, wherein a scale pitch of the first scale patterns is different from a scale pitch of the second scale patterns.

3. The semiconductor package as claimed in claim 2, wherein the second semiconductor device comprises a second top metal layer facing the first top metal layer and the second alignment pattern, the second top metal layer comprises a second circuit pattern electrically connected to the first circuit pattern, and the second alignment pattern is electrically insulated from the second circuit pattern.

4. The semiconductor package as claimed in claim 1, wherein the first semiconductor device comprises a first top metal layer having a first circuit pattern and the first alignment pattern, and the first alignment pattern is electrically insulated from the first circuit pattern.

5. The semiconductor package as claimed in claim 1, wherein a length of (n-1) scale pitches of the second scale pattern is equal to a length of (n) scale pitches of the first scale pattern.

6. The semiconductor package as claimed in claim 1, wherein a center of the first alignment pattern is aligned with a center of the second alignment pattern.

7. The semiconductor package as claimed in claim 1, wherein the first alignment pattern further having a first alignment mark adjacent to the plurality of first scale patterns, and the second alignment pattern further having a second alignment mark adjacent to the plurality of second scale patterns.

8. The semiconductor package as claimed in claim 7, wherein a contour of the first alignment mark is alignment with a contour of the second alignment mark from a top view.

9. The semiconductor package as claimed in claim 1, wherein the first semiconductor device comprises a plurality of first alignment marks arranged diagonally on the first semiconductor device, and the second semiconductor device comprises a plurality of second alignment marks arranged diagonally on the second semiconductor device.

10. The semiconductor package as claimed in claim 1, wherein the first alignment pattern further having a first alignment mark adjacent to the plurality of first scale patterns, the second alignment pattern further having a second alignment mark adjacent to the plurality of second scale patterns, and a contour of the first alignment mark is alignment with a contour of the second alignment mark from a top view.

11. A semiconductor package, comprising:
a first semiconductor device comprising a first top metal layer having a first circuit pattern and a first alignment pattern electrically insulated from the first circuit pattern, wherein the first alignment pattern having a plurality of first scale patterns arranged in a zigzag manner along a side of the first semiconductor device; and a second semiconductor device comprising a second top metal layer having a second circuit pattern and a second alignment pattern electrically insulated from the second circuit pattern, wherein the second alignment pattern having a plurality of second scale patterns arranged in a zigzag manner along a side of the second semiconductor device; and a plurality of conductive bumps bonded between the second semiconductor device and the first semiconductor device and electrically connected to the first circuit pattern and the second circuit pattern.

12. The semiconductor package as claimed in claim 11, further comprising a filler filling between the first semiconductor device and the second semiconductor device, encapsulating the plurality of conductive bumps 130.

13. The semiconductor package as claimed in claim 11, wherein the filler covering the first alignment pattern and the second alignment pattern.

14. The semiconductor package as claimed in claim 11, wherein the first circuit pattern and the second circuit pattern comprise a plurality of substrate pads or an UBM layer.

15. A semiconductor package, comprising:
a first semiconductor device comprising a first alignment pattern having a plurality of first scale patterns arranged along in a first center axis in a zigzag manner; and a second semiconductor device mounted over the first semiconductor device and comprising a second alignment pattern having a plurality of second scale patterns arranged along in a second center axis in a zigzag manner, wherein the first center axis is substantially parallel to and spaced apart from the second center axis.

16. The semiconductor package as claimed in claim 15, wherein the first alignment pattern does not overlap second alignment pattern from a top view.

17. The semiconductor package as claimed in claim 15, wherein a scale pitch of the first scale patterns is different from a scale pitch of the second scale patterns.

18. The semiconductor package as claimed in claim 15, wherein a total length of the first alignment pattern is different from a total length of the second alignment pattern.

19. The semiconductor package as claimed in claim 15, wherein a length of (n-1) scale pitches of the second scale pattern is equal to a length of (n) scale pitches of the first scale pattern.

20. The semiconductor package as claimed in claim 15, wherein a center of the first alignment pattern is aligned with a center of the second alignment pattern.

* * * * *